United States Patent
Armstrong et al.

(10) Patent No.: US 10,945,356 B2
(45) Date of Patent: Mar. 9, 2021

(54) COOKING EXHAUST SYSTEMS HAVING ONE OR MORE AIRFLOW FEATURES

(71) Applicant: Haier US Appliance Solutions, Inc., Wilmington, DE (US)

(72) Inventors: James Lee Armstrong, Louisville, KY (US); Michael A. Funk, Louisville, KY (US); Stephen Bernard Froelicher, Shepherdsville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 233 days.

(21) Appl. No.: 16/000,929

(22) Filed: Jun. 6, 2018

(65) Prior Publication Data

US 2019/0380230 A1 Dec. 12, 2019

(51) Int. Cl.
*H05K 7/20* (2006.01)
*F24C 15/00* (2006.01)
*G02F 1/1333* (2006.01)
*F24C 15/20* (2006.01)
*A47J 36/38* (2006.01)

(52) U.S. Cl.
CPC ....... *H05K 7/20972* (2013.01); *F24C 15/006* (2013.01); *G02F 1/133385* (2013.01); *A47J 36/38* (2013.01); *F24C 15/2021* (2013.01); *F24C 15/2042* (2013.01); *G02F 2201/36* (2013.01)

(58) Field of Classification Search
USPC ............................ 454/62, 249, 252, 345, 191
See application file for complete search history.

(56) References Cited

U.S. PATENT DOCUMENTS

| 3,889,099 | A | * | 6/1975 | Nuss | F24C 15/006 |
| | | | | | 219/393 |
| 4,483,316 | A | * | 11/1984 | Fritz | F24C 15/20 |
| | | | | | 126/299 D |
| 4,601,279 | A | * | 7/1986 | Guerin | F24C 15/2014 |
| | | | | | 126/21 A |
| 4,686,891 | A | * | 8/1987 | Pouchard | F24F 13/12 |
| | | | | | 126/193 |
| 4,865,010 | A | * | 9/1989 | Kett | F24C 15/006 |
| | | | | | 126/21 R |
| 5,673,681 | A | * | 10/1997 | Neitzel | A21B 1/48 |
| | | | | | 126/21 A |

(Continued)

FOREIGN PATENT DOCUMENTS

| CN | 2513031 Y | 9/2002 |
| CN | 205402847 U | 7/2016 |

(Continued)

*Primary Examiner* — Edelmira Bosques
*Assistant Examiner* — Frances F. Hamilton
(74) *Attorney, Agent, or Firm* — Dority & Manning, P.A.

(57) ABSTRACT

Cooking exhaust systems for use with a cooktop appliance are provided herein. An exhaust system may include a casing, an image monitor, and an air handler. The casing may define an air inlet and an air outlet above the cooktop appliance. The image monitor may be supported on the casing. The air handler may be mounted within the casing in fluid communication between the air inlet and the air outlet to motivate an airflow therethrough. The air outlet may define an airflow curtain path extending outward from the casing in front of the image monitor.

17 Claims, 10 Drawing Sheets

(56) References Cited

U.S. PATENT DOCUMENTS

| | | | | |
|---|---|---|---|---|
| 6,450,879 | B1* | 9/2002 | Suen | F24F 3/1607 |
| | | | | 126/299 D |
| 6,621,058 | B1* | 9/2003 | Kim | F24C 15/2028 |
| | | | | 126/21 A |
| 8,004,648 | B2* | 8/2011 | Dunn | G02F 1/133385 |
| | | | | 349/161 |
| 8,711,321 | B2 | 4/2014 | Dunn et al. | |
| 9,513,015 | B2* | 12/2016 | Estrella | F24C 15/006 |
| 10,788,222 | B2* | 9/2020 | Froelicher | F24C 15/20 |
| 2007/0089725 | A1* | 4/2007 | Patarchi | H04N 7/186 |
| | | | | 126/24 |
| 2008/0102743 | A1* | 5/2008 | Williams | F24C 15/20 |
| | | | | 454/56 |
| 2010/0182136 | A1* | 7/2010 | Pryor | F24C 7/082 |
| | | | | 340/425.5 |
| 2010/0232107 | A1* | 9/2010 | Dunn | G02F 1/133385 |
| | | | | 361/695 |
| 2012/0044217 | A1* | 2/2012 | Okada | G02F 1/133382 |
| | | | | 345/204 |
| 2015/0369491 | A1* | 12/2015 | Estrella | F24C 7/085 |
| | | | | 126/21 A |
| 2018/0372331 | A1* | 12/2018 | Serabatir | G02B 27/0006 |
| 2019/0195512 | A1* | 6/2019 | Sperka | F24C 15/2028 |
| 2019/0390858 | A1* | 12/2019 | Chu | F24C 15/2042 |
| 2020/0041139 | A1* | 2/2020 | Armstrong | F24C 15/2021 |

FOREIGN PATENT DOCUMENTS

| | | | | |
|---|---|---|---|---|
| DE | 3141617 A1 * | 5/1983 | | F24C 15/006 |
| WO | WO2017134213 A1 | 8/2017 | | |

* cited by examiner

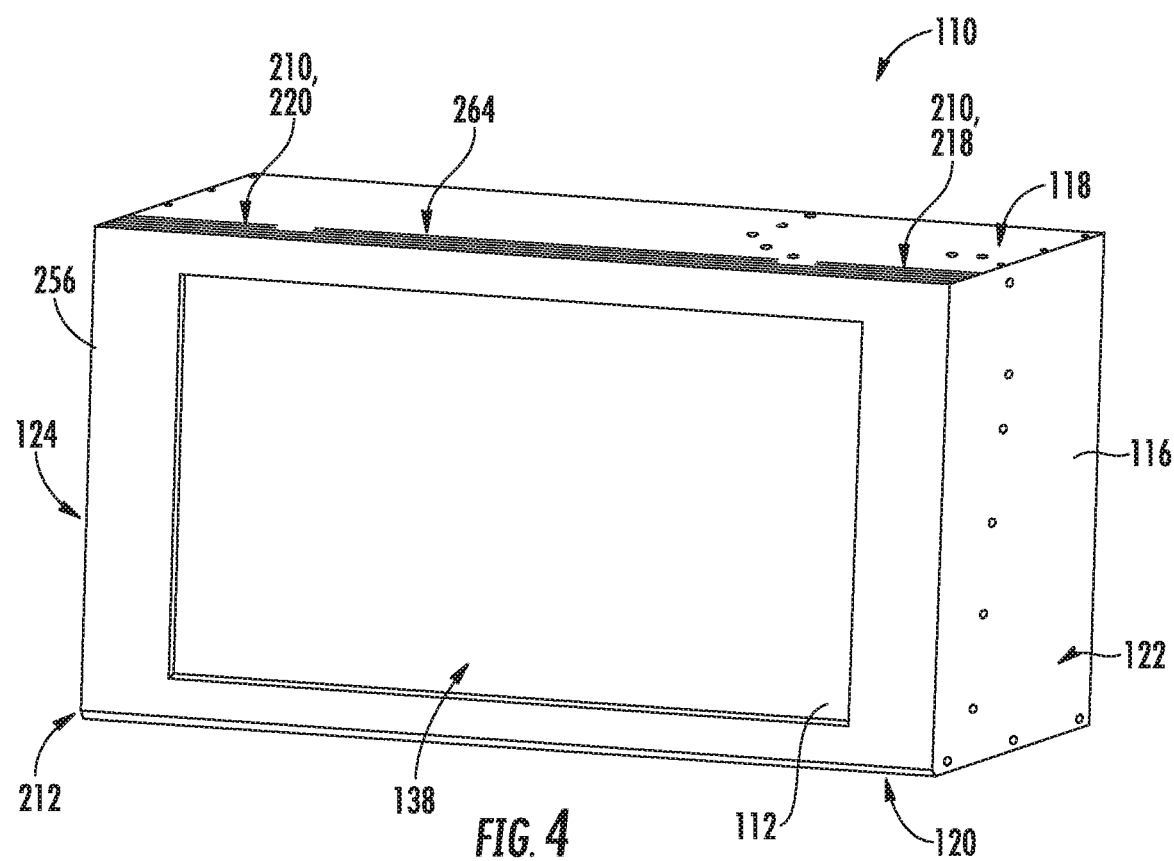
FIG. 4
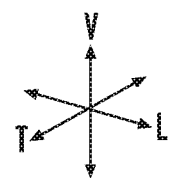

COOKING EXHAUST SYSTEMS HAVING ONE OR MORE AIRFLOW FEATURES

FIELD OF THE INVENTION

The present subject matter relates generally to systems for aiding cooking operations, and more particularly to systems for enhancing cooking engagement and managing exhaust airflows with a cooktop appliance.

BACKGROUND OF THE INVENTION

Cooktop or range appliances generally include heating elements for heating cooking utensils, such as pots, pans, and griddles. A variety of configurations can be used for the heating elements located on the cooking surface of the cooktop. The number of heating elements or positions available for heating on the range appliance can include, for example, four, six, or more depending upon the intended application and preferences of the buyer. These heating elements can vary in size, location, and capability across the appliance.

Unfortunately, existing systems can provide an unsatisfactory user experience and can inhibit a user's desired interactions. Recipe books are often cumbersome and difficult to use while cooking. Pages may rip, stain, burn, or become otherwise damaged during use. Moreover, printed materials do not allow for immediate real-time guidance or information. Electronic devices that are connected to the Internet, such as a computer, tablet, or smartphone, may allow for immediate interaction with remote information servers or individuals. However, such devices are generally not suitable for use in tandem with a cooktop appliance. A user may be forced to repeatedly move away from the cooktop appliance in order to view the device or provide any input instructions. Moreover, the extreme environment near a cooktop appliance may risk damaging the device. For instance, a display of the device may be rendered unusable. In particular, food or steam may obscure the display. In some cases, heat or exhaust fumes may be directed to the display, increasing the potential for display failure.

As a result, improved systems are needed for facilitating user engagement and interaction during use of a cooktop appliance. In particular, it may be advantageous to provide a user engagement system to permit the viewing or accessing images and information while using a cooktop appliance. In some cases, it may be advantageous to further provide a user engagement system configured to protect one or more electronic components from the extreme environment near or above a cooktop appliance.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, an exhaust system is provided. The exhaust system may include a casing, an image monitor, and an air handler. The casing may define an air inlet and an air outlet above a cooktop appliance. The image monitor may be supported on the casing above the air outlet. The air handler may be mounted within the casing in fluid communication between the air inlet and the air outlet to motivate an airflow therethrough. The air outlet may define an airflow curtain path extending outward from the casing in front of the image monitor.

In another exemplary aspect of the present disclosure, an exhaust system is provided. The exhaust system may include a casing, an image monitor, and an air handler. The casing may define an air inlet, a first air outlet, and a second air outlet above a cooktop appliance. The second air outlet may be above the first air outlet. The image monitor may be supported on the casing above the first air outlet. The image monitor may define an imaging surface The air handler may be mounted within the casing in fluid communication between the air inlet and the first air outlet to motivate an airflow therethrough. The first air outlet may define an airflow curtain path extending outward from the casing in front of the image monitor. The second air outlet may define a coolant airflow path extending from a position above the imaging surface and therealong.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 4 provides a perspective view of an interactive assembly of a system according to exemplary embodiments of the present disclosure.

DETAILED DESCRIPTION

Figure 1:
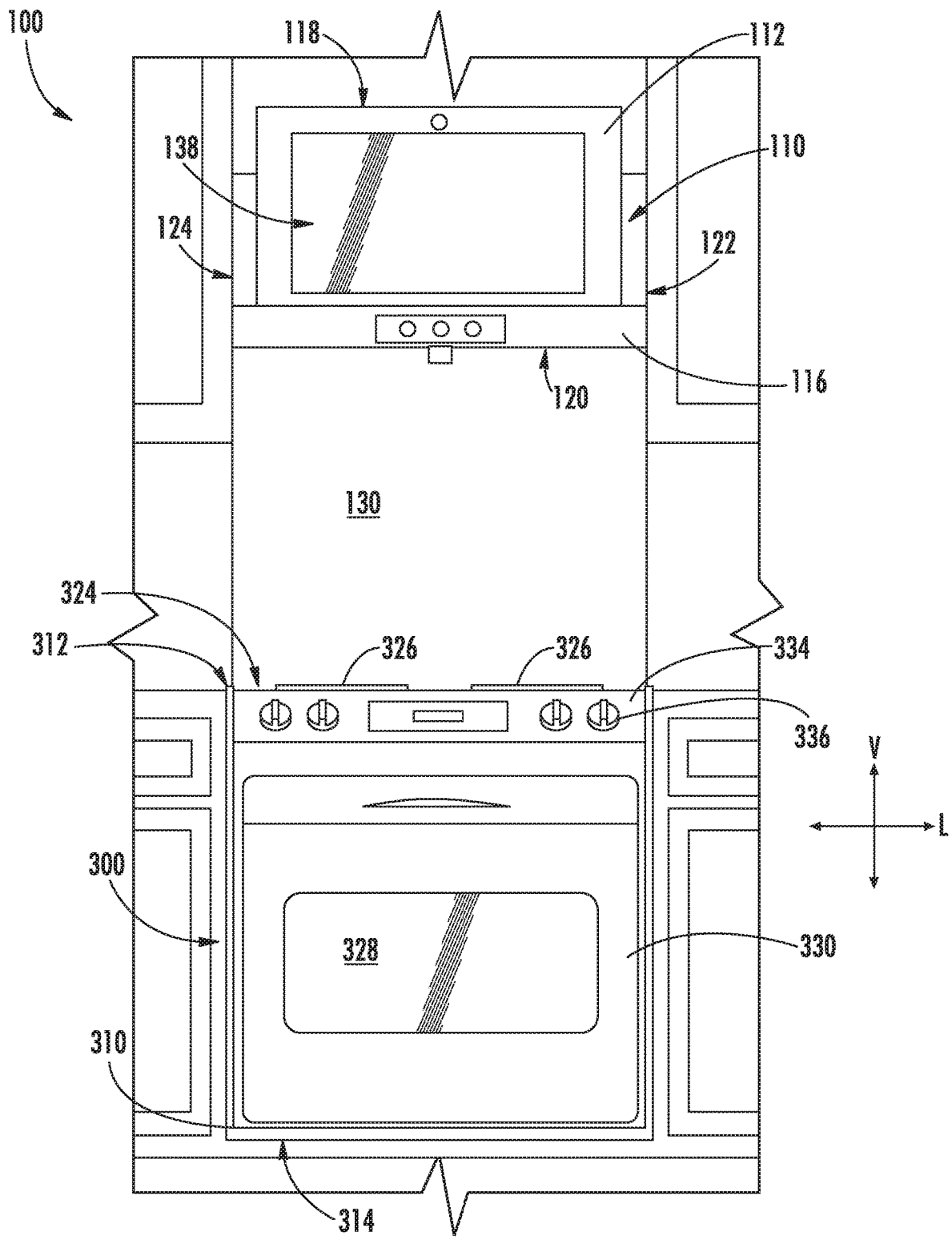
FIG. 1 provides a front perspective view of a system according to exemplary embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In order to aid understanding of this disclosure, several terms are defined below. The defined terms are understood to have meanings commonly recognized by persons of ordinary skill in the arts relevant to the present disclosure. The terms "includes" and "including" are intended to be inclusive in a manner similar to the term "comprising." Similarly, the term "or" is generally intended to be inclusive (i.e., "A or B" is intended to mean "A or B or both"). The terms "first," "second," and "third" may be used interchangeably to distinguish one component from another and are not intended to signify location or importance of the individual components.

Figure 2:
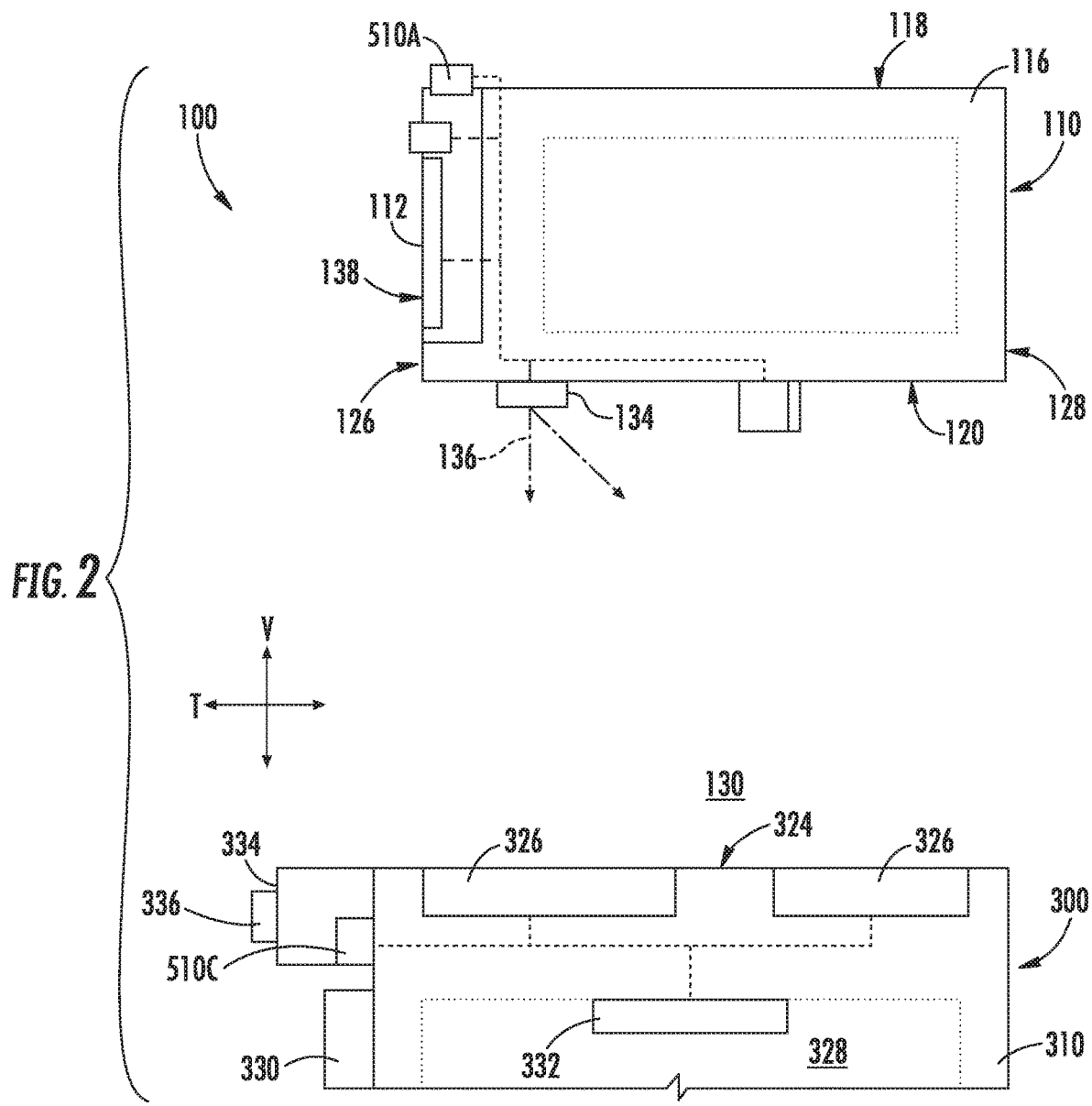
FIG. 2 provides a side schematic view of the exemplary system of FIG. 1.
Figure 3:
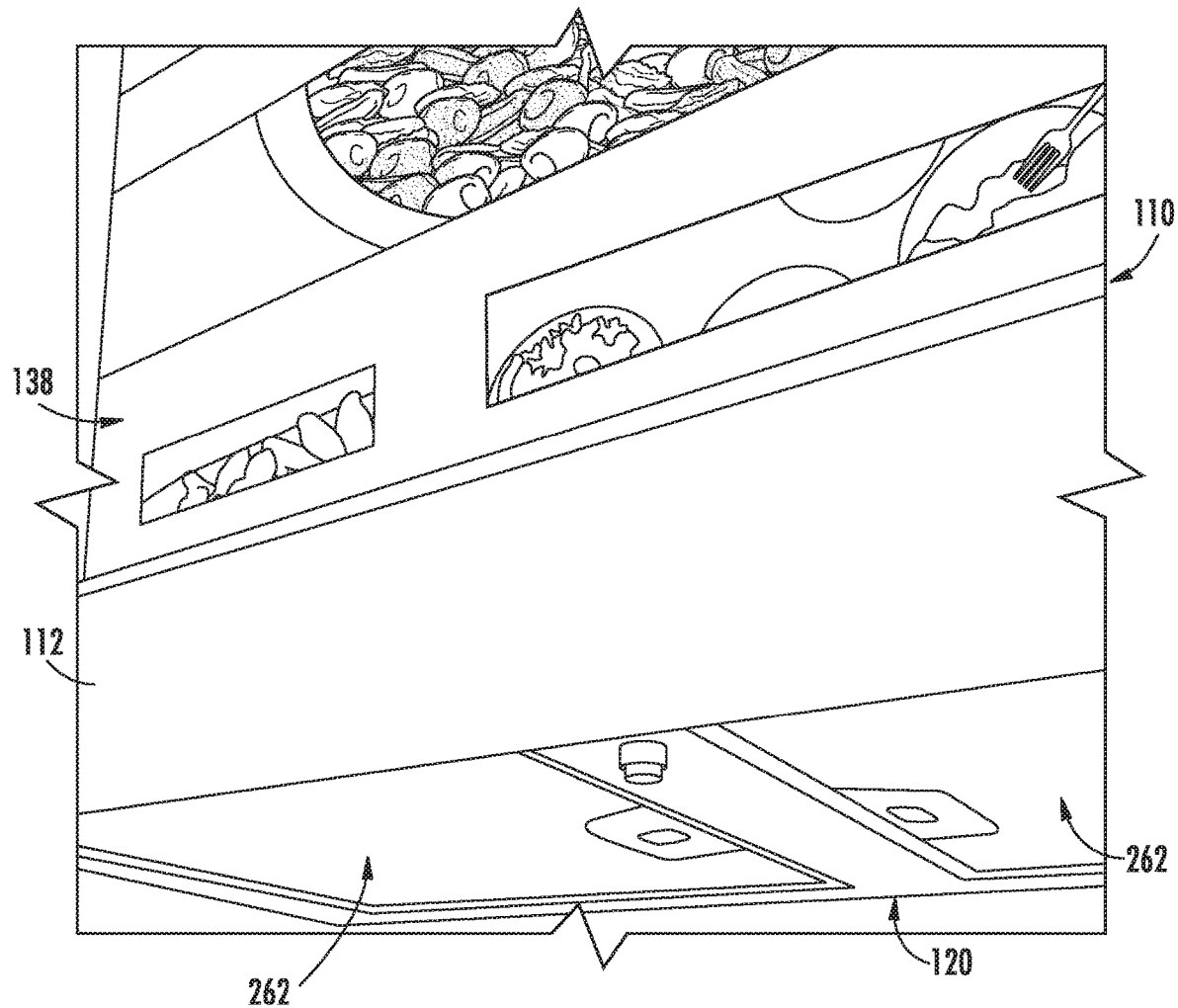
FIG. 3 provides a bottom perspective view of a portion of the exemplary system of FIG. 1.

Turning to the figures, FIGS. 1 through 3 provide various views of a system 100 according to exemplary embodiments of the present disclosure. System 100 generally includes an interactive assembly 110 having a controller 510A in operable communication with an image monitor 112 that is generally positioned above a cooktop appliance 300.

As shown cooktop appliance 300 defines a vertical direction V, a lateral direction L, and a transverse direction T, for example, at a cabinet 310. The vertical, lateral, and transverse directions are mutually perpendicular and form an orthogonal direction system. As shown, cooktop appliance 300 extends along the vertical direction V between a top portion 312 and a bottom portion 314; along the lateral direction L between a left side portion and a right side portion; and along the traverse direction T between a front portion and a rear portion.

Cooktop appliance 300 can include a chassis or cabinet 310 and a cooktop surface 324 having one or more heating elements 326 for use in, for example, heating or cooking operations. In one example embodiment, cooktop surface 324 is constructed with ceramic glass. In other embodiments, however, cooktop surface 324 may include another suitable material, such as a metallic material (e.g., steel) or another suitable non-metallic material. Heating elements 326 may be various sizes and may employ any suitable method for heating or cooking an object, such as a cooking utensil (not shown), and its contents. In one embodiment, for example, heating element 326 uses a heat transfer method, such as electric coils or gas burners, to heat the cooking utensil. In another embodiment, however, heating element 326 uses an induction heating method to heat the cooking utensil directly. In turn, heating element 326 may include a gas burner element, resistive heat element, radiant heat element, induction element, or another suitable heating element.

In some embodiments, cooktop appliance 300 includes an insulated cabinet 310 that defines a cooking chamber 328 selectively covered by a door 330. One or more heating elements 332 (e.g., top broiling elements or bottom baking elements) may be enclosed within cabinet 310 to heat cooking chamber 328. Heating elements 332 within cooking chamber 328 may be provided as any suitable element for cooking the contents of cooking chamber 328, such as an electric resistive heating element, a gas burner, a microwave element, a halogen element, etc. Thus, cooktop appliance 300 may be referred to as an oven range appliance. As will be understood by those skilled in the art, cooktop appliance 300 is provided by way of example only, and the present subject matter may be used in the context of any suitable cooking appliance, such as a double oven range appliance or a standalone cooktop (e.g., fitted integrally with a surface of a kitchen counter). Thus, the example embodiments illustrated in figures are not intended to limit the present subject matter to any particular cooking chamber or heating element configuration, except as otherwise indicated.

As illustrated, a user interface panel 334 may be provided on cooktop appliance 300. Although shown at front portion of cooktop appliance 300, another suitable location or structure (e.g., a backsplash) for supporting user interface panel 334 may be provided in alternative embodiments. In some embodiments, user interface panel 334 includes input components or controls 336, such as one or more of a variety of electrical, mechanical, or electro-mechanical input devices. Controls 336 may include, for example, rotary dials, knobs, push buttons, and touch pads. A controller 510C is in communication with user interface panel 334 and controls 336 through which a user may select various operational features and modes and monitor progress of cooktop appliance 300. In additional or alternative embodiments, user interface panel 334 includes a display component, such as a digital or analog display in communication with a controller 510C and configured to provide operational feedback to a user. In certain embodiments, user interface panel 334 represents a general purpose I/O ("GPIO") device or functional block.

As shown, controller 510C is communicatively coupled (i.e., in operative communication) with user interface panel 334 and its controls 336. Controller 510C may also be communicatively coupled with various operational components of cooktop appliance 300 as well, such as heating elements (e.g., 326, 332), sensors, etc. Input/output ("I/O") signals may be routed between controller 510C and the various operational components of cooktop appliance 300. Thus, controller 510C can selectively activate and operate these various components. Various components of cooktop appliance 300 are communicatively coupled with controller 510C via one or more communication lines such as, for example, conductive signal lines, shared communication busses, or wireless communications bands.

In some embodiments, controller 510C includes one or more memory devices and one or more processors. The processors can be any combination of general or special purpose processors, CPUs, or the like that can execute programming instructions or control code associated with operation of cooktop appliance 300. The memory devices (i.e., memory) may represent random access memory such as DRAM or read only memory such as ROM or FLASH. In one embodiment, the processor executes programming instructions stored in memory. The memory may be a separate component from the processor or may be included onboard within the processor. Alternatively, controller 510C may be constructed without using a processor, for example, using a combination of discrete analog or digital logic circuitry (such as switches, amplifiers, integrators, comparators, flip-flops, AND gates, and the like) to perform control functionality instead of relying upon software.

In certain embodiments, controller 510C includes a network interface such that controller 510C can connect to and communicate over one or more networks with one or more network nodes. Controller 510C can also include one or more transmitting, receiving, or transceiving components for transmitting/receiving communications with other devices communicatively coupled with cooktop appliance 300. Additionally or alternatively, one or more transmitting, receiving, or transceiving components can be located off board controller 510C. Generally, controller 510C can be positioned in any suitable location throughout cooktop appliance 300. For example, controller 510C may be located proximate user interface panel 334 toward front portion of cooktop appliance 300.

In some embodiments, cooktop controller 510C is provided as or as part of controller 510A. In alternative embodiments, cooktop controller 510C is a discrete unit in selective operable communication with controller 510A (e.g., through one or more wired or wireless channels).

As shown, one or more casings (e.g., hood casing 116) may be provided above cooktop appliance 300 along the vertical direction V. For example, a hood casing 116 may be positioned above cooktop appliance 300. Hood casing 116 includes a plurality of outer walls and generally extends along the vertical direction V between a top end 118 and a bottom end 120; along the lateral direction L between a first side end 122 and a second side end 124; and along the transverse direction T between a front end 126 and a rear end 128. In some embodiments, hood casing 116 is spaced apart from cooktop surface 324 along the vertical direction V. An open region 130 may thus be defined along the vertical direction V between cooktop surface 324 and bottom end 120.

In optional embodiments, hood casing 116 is formed as a range hood. As will be described in detail below, a ventilation assembly 140 (e.g., FIGS. 6 and 7) within hood casing 116 may thus direct an airflow from the open region 130 and through hood casing 116. However, a range hood is provided by way of example only. Other configurations may be used within the spirit and scope of the present disclosure. For example, hood casing 116 could be part of a microwave or other appliance designed to be located over cooktop surface 324. Moreover, although a generally rectangular shape is illustrated, any suitable shape or style may be adapted to form the structure of hood casing 116.

In some embodiments, a lighting assembly 134 is provided above cooktop surface 324 (e.g., along the vertical direction V). For instance, lighting assembly 134 may be mounted to hood casing 116 (e.g., directly above cooktop surface 324). Generally, lighting assembly 134 includes one or more selectable light sources directed toward cooktop surface 324. In other words, lighting assembly 134 is oriented to project a light (as indicated at arrows 136) to cooktop appliance 300 through open region 130 and illuminate at least a portion of cooktop surface 324. The light sources may include any suitable light-emitting elements, such as one or more light emitting diode (LED), incandescent bulb, fluorescent bulb, halogen bulb, etc.

During use, lighting assembly 134 may be selectively activated to illuminate a portion of cooktop appliance 300 (e.g., cooktop surface 324) based on a received light visibility signal. For instance, lighting assembly 134 may be activated by controller 510A based on direct user input (e.g., depressing a dedicated switch, a gesture control signal, voice control signal, etc.). In other words, the light visibility signal may be an isolated user input signal. Alternatively, the light visibility signal may be an automatically-generated signal that does not require direct user input. The light visibility signal may indicate additional light is needed above cooktop appliance 300. In turn, controller 510A may automatically activate lighting assembly 134 based on a determined condition. Optionally, one or more camera assemblies may be mounted to hood casing 116 and directed toward cooktop appliance 300 or an area in front of cooktop appliance 300 (e.g., to operate with or independently of lighting assembly 134).

In some embodiments, image monitor 112 is provided above cooktop surface 324 (e.g., along the vertical direction V). For instance, image monitor 112 may be mounted to or supported on hood casing 116 (e.g., directly above cooktop surface 324) proximal to the front end 126. Generally, image monitor 112 may be any suitable type of mechanism for visually presenting a digital (e.g., interactive) image. For example, image monitor 112 may be a liquid crystal display (LCD), a plasma display panel (PDP), a cathode ray tube (CRT) display, etc. Thus, image monitor 112 includes an imaging surface 138 (e.g., screen or display panel) at which the digital image is presented or displayed as an optically-viewable picture (e.g., static image or dynamic video) to a user. Optionally, a protective transparent panel (e.g., formed from a transparent glass, plastic, etc.) may be positioned across or over imaging surface 138. In some such embodiments, the protective transparent panel is mounted within or supported on hood casing 116 forward from imaging surface 138 along the transverse direction T.

The optically-viewable picture at the imaging surface 138 may correspond to any suitable signal or data received or stored by interactive assembly 110 (e.g., at controller 510A). As an example, image monitor 112 may present recipe information in the form of viewable text or images. As another example, image monitor 112 may present a remotely captured image, such as a live (e.g., real-time) dynamic video stream received from a separate user or device. As yet another example, image monitor 112 may present a graphical user interface (GUI) that allows a user to select or manipulate various operational features of interactive assembly 110 or cooktop appliance 300. During use of such GUI embodiments, a user may engage, select, or adjust the image presented at image monitor 112 through any suitable input, such as gesture controls detected through a camera assembly, voice controls detected through one or more microphones, associated touch panels (e.g., capacitance or resistance touch panel) or sensors overlaid across imaging surface 138, etc.

As illustrated, the imaging surface 138 generally faces, or is directed away from, cooktop surface 324. In particular, the imaging surface 138 is directed toward the area forward from the cooktop appliance 300. During use, a user standing in front of cooktop appliance 300 may thus see the optically-viewable picture (e.g., recipe, dynamic video stream, graphical user interface, etc.) displayed at the imaging surface 138. Optionally, the imaging surface 138 may be positioned at a rearward non-orthogonal angle relative to the vertical direction V. In other words, the imaging surface 138 may be inclined such that an upper edge of the imaging surface 138 is closer to the rear end 128 of hood casing 116 than a lower edge of the imaging surface 138 is. In some such embodiments, the non-orthogonal angle is between 1° and 15° relative to the vertical direction V. In certain embodiments, the non-orthogonal angle is between 2° and 7° relative to the vertical direction V.

Figure 5:
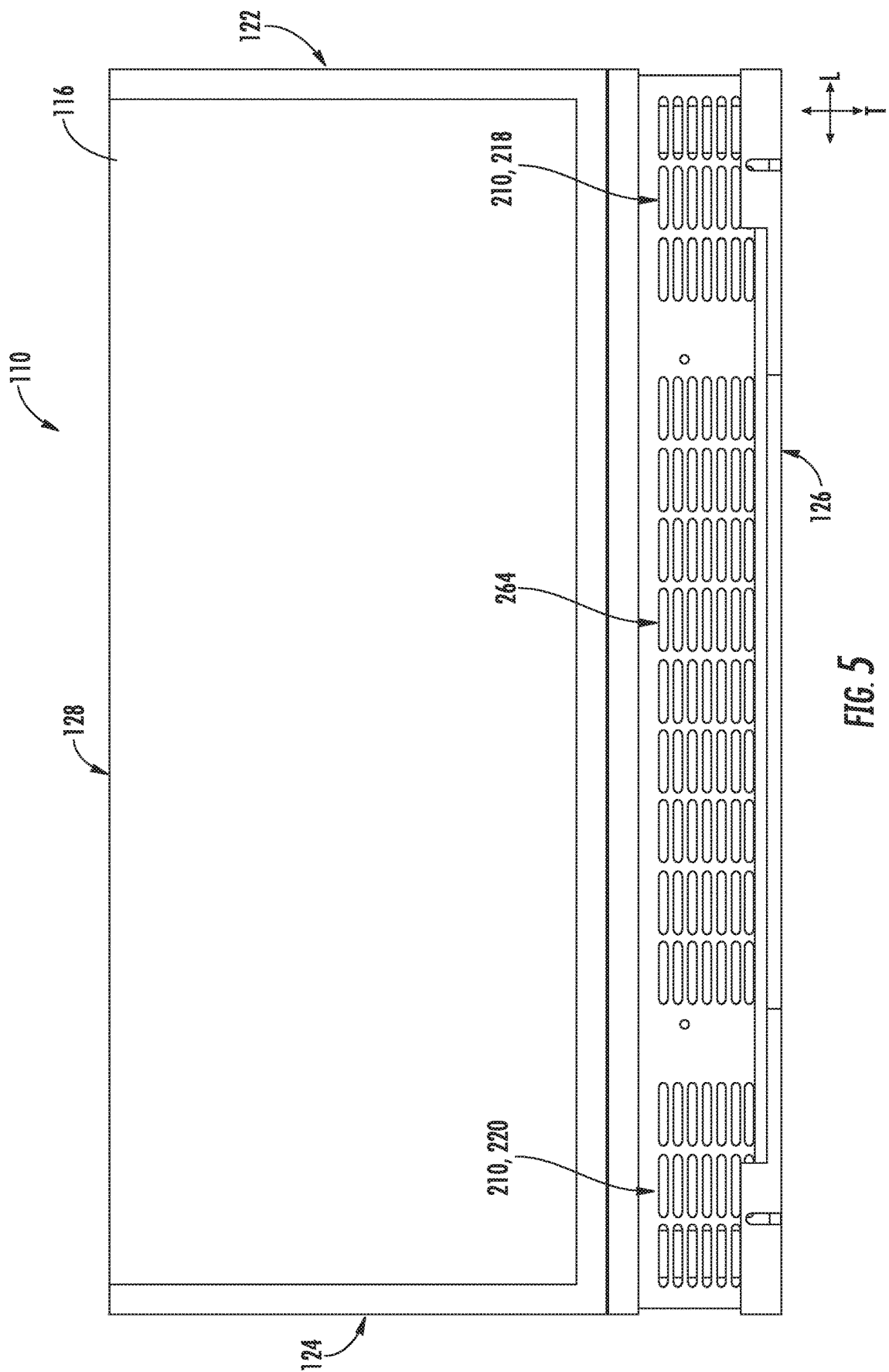
FIG. 5 provides a top perspective view of the exemplary interactive assembly of FIG. 4.
Figure 6:
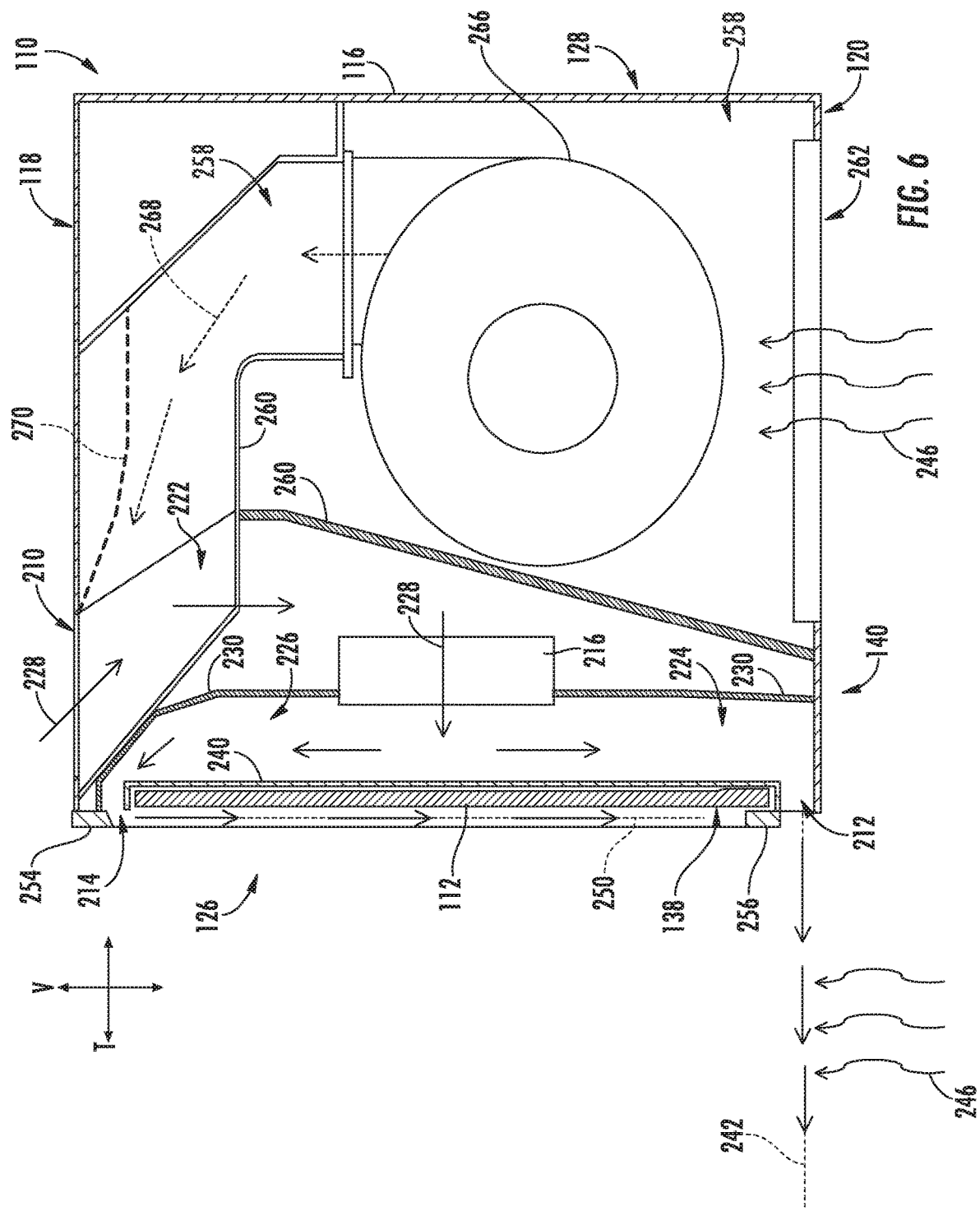
FIG. 6 provides a cross-sectional schematic view of an interactive assembly of a system according to exemplary embodiments of the present disclosure.

Turning now to FIGS. 4 through 6, various views are provided of interactive assembly 110 according to exemplary embodiments of the present disclosure. As shown, hood casing 116 extends in the vertical direction V from a top end 118 to a bottom end 120, the transverse direction T between a front end 126 and the rear end 128, and in the lateral direction L from the first side end 122 to a second side end 124. One or more air inlets 210 and air outlets 212, 214 may be defined by hood casing 116 (e.g., through one or more external walls of hood casing 116). Moreover, one or more air handlers 216 (e.g., fans or blowers) may be provided in fluid communication with hood casing 116 to motivate an airflow through one or more passages or cavities defined within hood casing 116 between the air inlet 210 and the air outlets 212, 214. Thus, an air handler 216 may be mounted within hood casing 116 downstream from at least one air inlet 210 and upstream from at least one air outlet 212 or 214.

In some embodiments, an air inlet 210 is defined at a position proximal to the top end 118 (e.g., above image monitor 112 relative to the vertical direction V), while one or more of air outlets 212, 214 are defined at a position (e.g., discrete positions) proximal to the front end 126. Additionally or alternatively, the air inlet 210 may be defined through the hood casing 116 behind the image monitor 112 relative to the transverse direction T. As shown, for instance in FIG. 5, air inlet 210 may include a plurality of inlet apertures defined through a top wall of hood casing 116. In optional embodiments, the inlet apertures include a first aperture set 218 that is spaced apart from a second aperture set 220 (e.g., along the lateral direction L). First aperture set 218 may be proximal to first side end 122 and second aperture set 220 may be proximal to second side end 124. Thus, air may be drawn into hood casing 116 from both first side end 122 and second side end 124.

One or more air passages are defined in fluid communication between air inlet 210 and air outlets 212, 214. As an example, an air intake passage 222 may be defined within hood casing 116 downstream from air inlet 210. For instance, air intake passage 222 may be defined at a location between the front end 126 and the rear end 128. Optionally, intake passage 222 may provide a common cavity open to both first aperture set 218 and second aperture set 220. Additionally or alternatively, air intake passage 222 may extend generally along the vertical direction V and rearward along the transverse direction T (e.g., behind or rearward from image monitor 112). One or more outlet passages 224, 226 are defined downstream of intake passage 222. For instance, a lower outlet passage 224 may extend downward along the vertical direction V to a first air outlet 212 (e.g., proximal to bottom end 120), while an upper outlet passage 226 extends upward along the vertical direction V to a second air outlet 214 (e.g., proximal to top end 118).

Turning especially to FIG. 6, in exemplary embodiments a common or shared air handler 216 may be positioned in fluid communication between air intake passage 222 and air outlet passages 224, 226. Common air handler 216 may be provided as any suitable blower or fan (e.g., radial fan, tangential fan, etc.) positioned within hood casing 116 to actively rotate or motivate air therethrough. In particular, common air handler 216 may be positioned upstream from both the first air outlet 212 and the second air outlet 214. As an example, common air handler 216 may be mounted to or on an internal duct wall 230 separating air intake passage 222 from air outlet passages 224, 226. Common air handler 216 may thus motivate an airflow (e.g., as indicated arrows 228) from air inlet 210 to first air outlet 212 and second air outlet 214 simultaneously.

Figure 7:
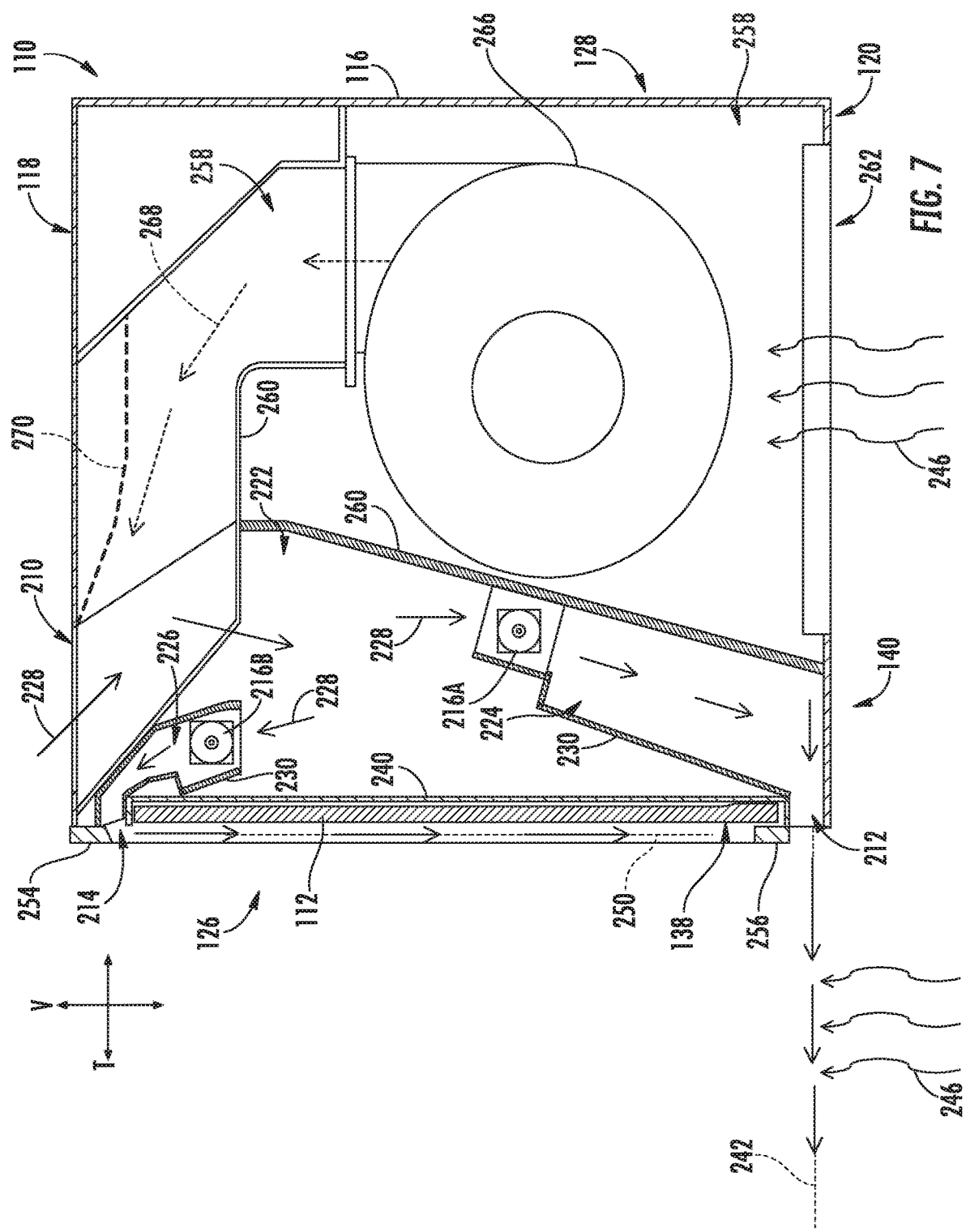
FIG. 7 provides a cross-sectional schematic view of an interactive assembly of a system according to other exemplary embodiments of the present disclosure.

Turning briefly to FIG. 7, further exemplary embodiments are illustrated. Although exemplary embodiments may provide the common air handler 216 upstream from multiple air outlets 212, 214 (e.g., FIG. 6), other exemplary embodiments include multiple discrete air handlers 216A, 216B that correspond to different air outlets 212, 214. For instance, a first air handler 216A may be provided upstream from the first air outlet 212, while second air handler 216B is provided upstream from the second air outlet 214. Both air handlers 216A, 216B may be provided in fluid parallel to each other. As shown, in some such embodiments, upper outlet passage 226 and lower outlet passage 224 are defined, at least in part, by separate duct walls 230. Additionally or alternatively, upper outlet passage 226 and lower outlet passage 224 may be spaced apart along the vertical direction V. First air handler 216A may be mounted on or within lower outlet passage 224, while second air handler 216B may be mounted on or within upper outlet passage 226. As would be understood, first and second air handlers 216A, 216B may each be provided as any suitable blower or fan (e.g., radial fan, tangential fan, etc.) positioned within hood casing 116 to actively rotated or motivate air therethrough.

As shown in FIGS. 6 and 7, in some embodiments, an internal wall 240 is positioned between the image monitor 112 and one or both of the intake passage 222 or the air outlet passages 224, 226 along the transverse direction T (e.g., such that internal wall 240 separates image monitor 112 and intake passage 222 or outlet passages 224, 226). Advantageously, the airflow across internal wall 240 may convectively cool the electronic components within hood casing 116 (e.g., image monitor 112). Moreover, cooling may occur without passing the airflow directly across such electronic components.

In certain embodiments, one air outlet (e.g., curtain air outlet or first air outlet 212) is provided below image monitor 112. In particular, first air outlet 212 is defined through hood casing 116 at the front end 126. First air outlet 212 may be defined directly below image monitor 112. Thus, at least a portion of the airflow motivated by airflow motivated by air handler 216 or air handler 216A may be directed from air inlet 210 to the ambient environment in front of hood casing 116 and image monitor 112 through first air outlet 212.

An airflow curtain path 242 is generally defined by first air outlet 212. In particular, airflow curtain path 242 may extend outward (e.g., in the transverse direction T) from hood casing 116 in front of the image monitor 112. Thus, air exhausted through first air outlet 212 is projected from hood casing 116 along airflow curtain path 242, forming a curtain or blade of fast-moving air in front of hood casing 116 (i.e., forward from hood casing 116 along the transverse direction T). In certain embodiments, airflow curtain path 242 is defined to have an airflow angle between 0° and 90° with respect to (i.e., relative to) one or both of the vertical direction V or the imaging surface 138 (e.g., in a direction generally parallel to or away from cooktop appliance 300—FIG. 1). Thus, airflow curtain path 242 (and its associated curtain of air) extends from hood casing 116 or imagine monitor 112 along the airflow angle.

During use, heat, steam, or exhaust fumes (e.g., as represented by arrows 246) generated at cooktop appliance 300 (or another location directly beneath first air outlet 212) may be advantageously blocked or restricted by the mass of air flowing along airflow curtain path 242. In turn, the visibility at imaging surface 138 may be preserved, while further protecting various electronic components (e.g., imagine monitor 112 or controller 510A—FIG. 2) mounted within hood casing 116 from damage that may be caused by heat, steam, or exhaust fumes 246. Optionally, image monitor 112 may be positioned such that imaging surface 138 extends away from airflow curtain path 242 (e.g., along a non-orthogonal angle relative to the vertical direction V, as described above).

In some embodiments, the airflow angle is between 10° and 90° relative to vertical direction V. In other embodiments, the airflow angle is between 20° and 50°. In still other embodiments, the airflow angle is between 30° and 40° relative to vertical direction V.

Figure 11:
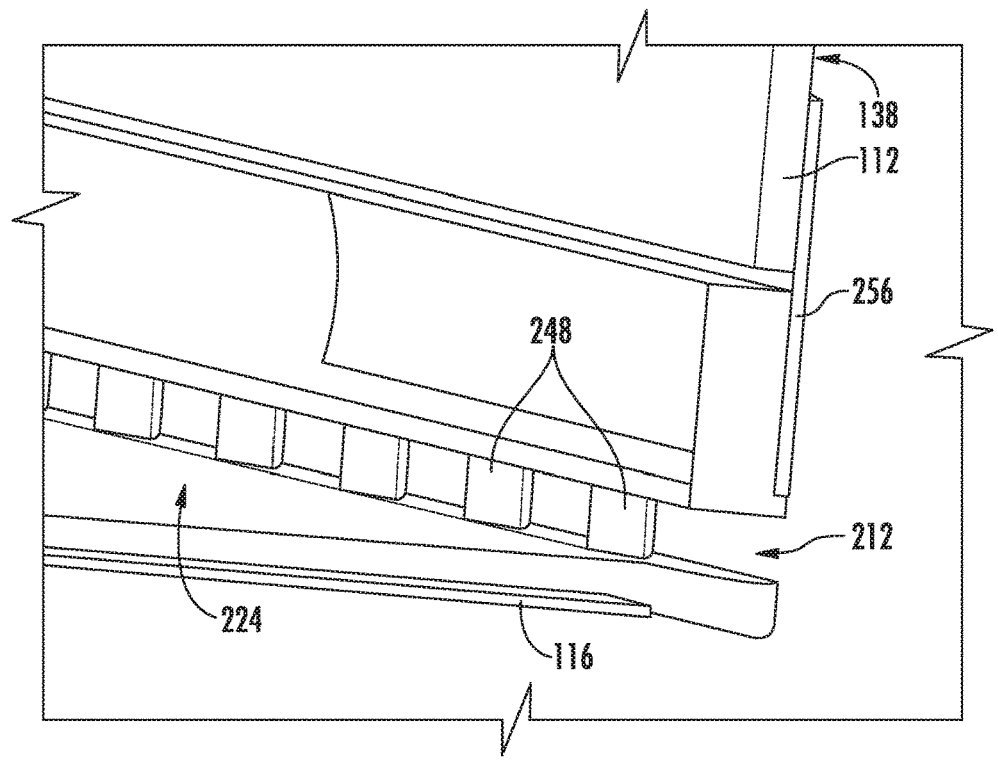
FIG. 11 provides an internal perspective view of a bottom portion of an interactive assembly of a system according to exemplary embodiments of the present disclosure.

Turning briefly to FIG. 11, an internal perspective view is provided of first air outlet 212. As shown, one or more bottom guide vanes 248 may be provided within first air outlet 212. In particular, each bottom guide vane 248 may extend along the vertical direction V from a top to a bottom of first air outlet 212. In certain embodiments, multiple vanes of a plurality of bottom guide vanes 248 are spaced apart along the lateral direction L (FIG. 4). As air is motivated to first air outlet 212, the plurality of bottom guide vanes 248 may further direct the air (e.g., along the airflow curtain path 242—FIGS. 6 and 7) outward and away from hood casing 116.

Returning to FIGS. 6 and 7, in certain embodiments, another air outlet (e.g., an upper or second air outlet 214) is defined through hood casing 116. For instance, second air outlet 214 may be defined through hood casing 116 at the top end 118. In particular, second air outlet 214 may be directed downward at the front end 126 of hood casing 116 forward from imaging surface 138. Along with being positioned forward from imaging surface 138, second air outlet 214 may be positioned above imaging surface 138. As illustrated second air outlet 214 may define a coolant airflow path 250 along imaging surface 138. Coolant airflow path 250 may extend from a position above the imaging surface 138 and therealong. Thus, at least a portion of the airflow motivated by air handler 216 or air handler 216B may be directed from intake passage 222 to the ambient environment as it flows along imaging surface 138. Optionally, coolant airflow path 250 may be defined parallel to imaging surface 138, or otherwise at a nonparallel angle relative to the airflow angle of the airflow curtain path 242. Advantageously, the coolant airflow path 250 may draw heat from image monitor 112 and further prevent gas, fumes, or moisture from accumulating on imaging surface 138.

Figure 10:
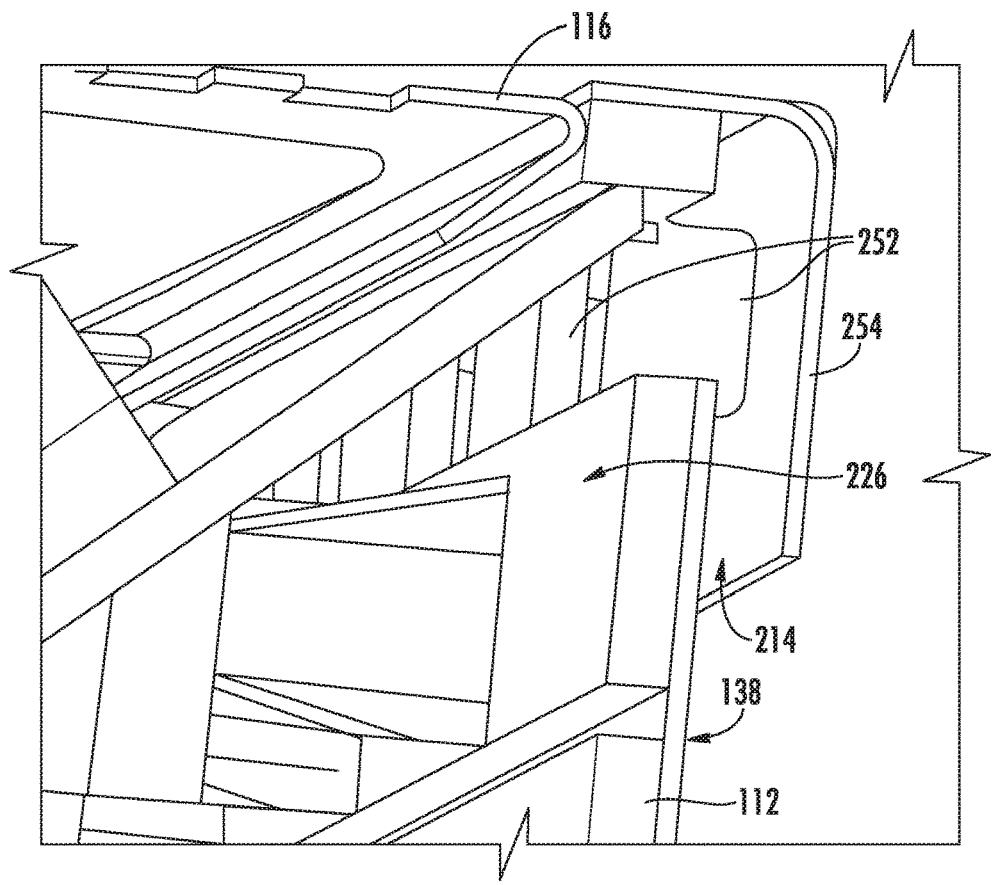
FIG. 10 provides an internal perspective view of a top portion of an interactive assembly of a system according to exemplary embodiments of the present disclosure.

Turning briefly to FIG. 10, an internal perspective view is provided of second air outlet 214. As shown, one or more top guide vanes 252 may be provided within first air outlet 212. In particular, each top guide vane 252 may extend along the vertical direction V from a top to a bottom of second air outlet 214. In certain embodiments, multiple vanes of a plurality of top guide vanes 252 are spaced apart along the lateral direction L (FIG. 4). A lateral front plate 254 may be positioned in front of top guide vanes 252. As air is motivated to second air outlet 214, the top plurality of guide vanes 248 and lateral front plate 254 may further direct the air downward and along imaging surface 138 (e.g., along the coolant airflow path 250—FIGS. 6 and 7).

Figure 8:
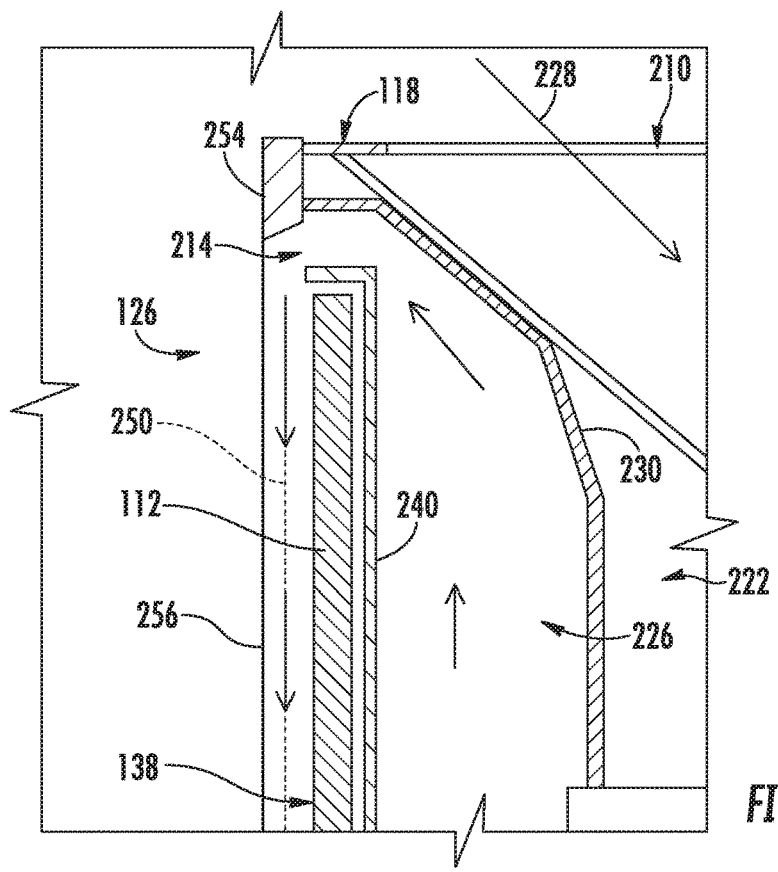
FIG. 8 provides a cross-sectional schematic view of a top portion of an interactive assembly of a system according to exemplary embodiments of the present disclosure.
Figure 12:
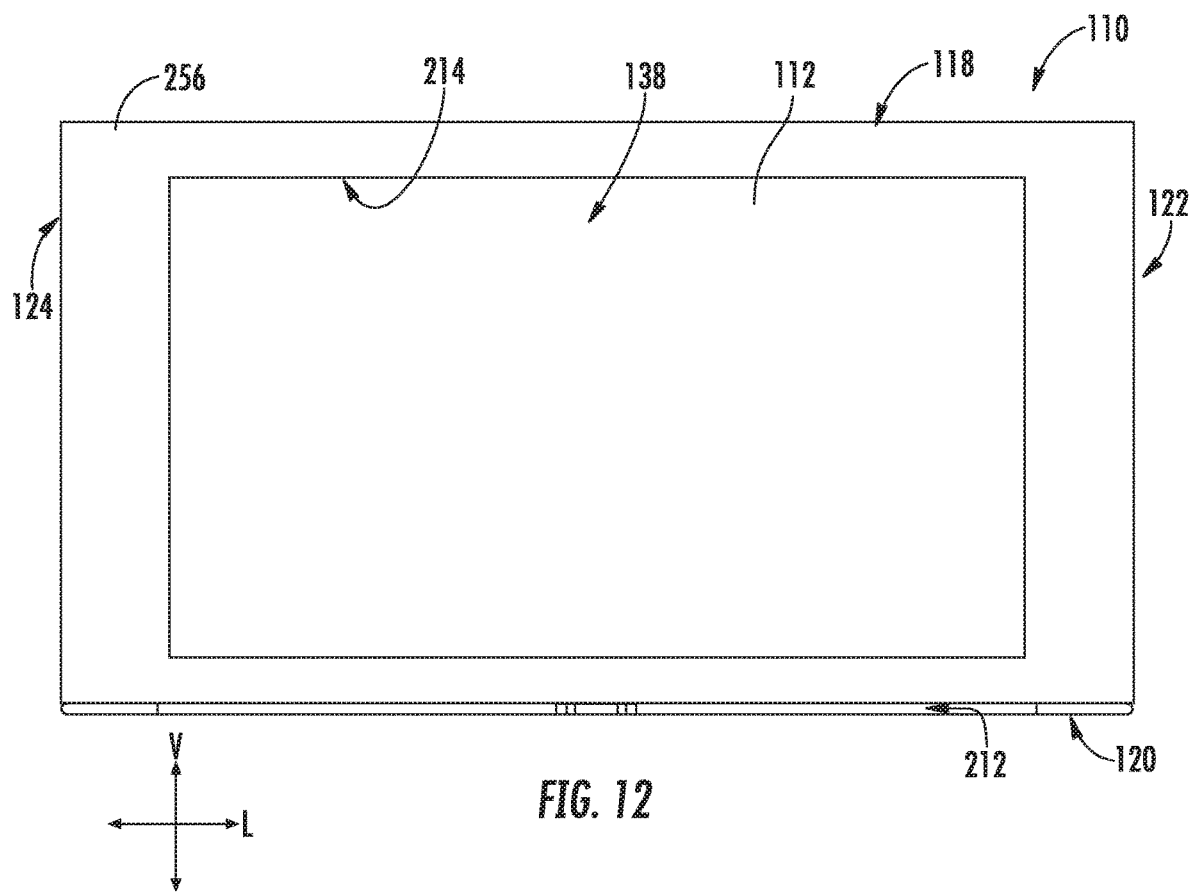
FIG. 12 provides a front perspective view of an interactive assembly of a system according to exemplary embodiments of the present disclosure.

Turning now to FIGS. 8 and 12, various views are provided of exemplary embodiments. In particular, exemplary embodiments may define second air outlet 214 along the bezel panel 256 of the image monitor 112. As shown, bezel panel 256 may frame imaging surface 138 the transverse direction T and lateral direction L. In other words, bezel panel 256 may extend about a perimeter of imaging surface 138 at a position forward therefrom. At least a portion of bezel panel 256 may hold, for instance, a front panel of imaging surface 138 in place (e.g., such that movement of the front panel in the transverse direction T is restricted). The lateral front plate 254 is formed at least in part by a front portion of bezel panel 256. Second air outlet 214 may be defined between the bezel panel 256 and the imaging surface 138. Coolant airflow path 250 may be formed directly on imaging surface 138. In some such embodiments, second air outlet 214 extends along the lateral direction L from a first side edge of imaging surface 138 to a second side edge of imaging surface 138.

Figure 9:
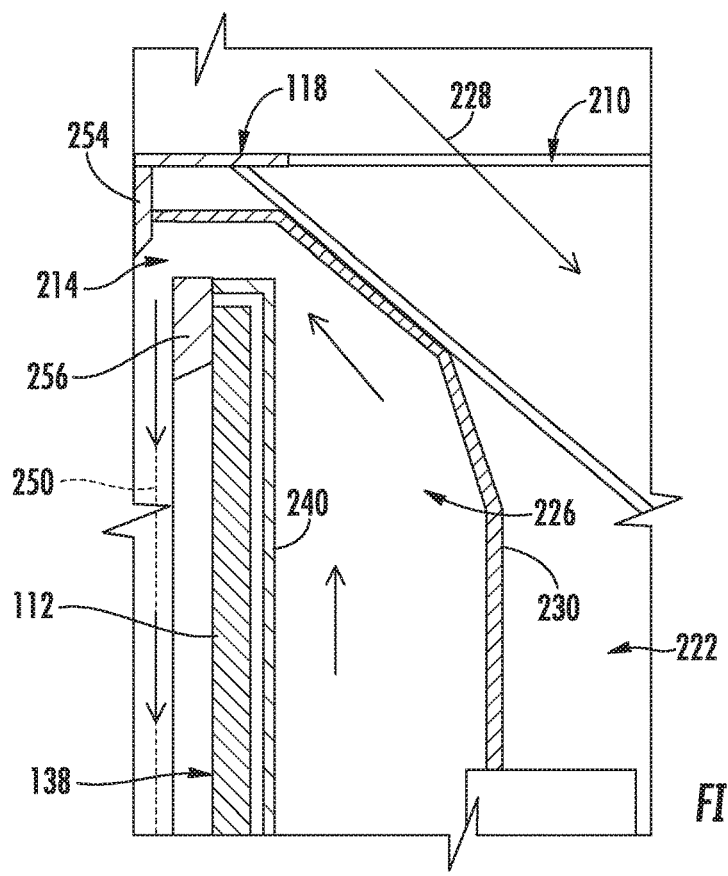
FIG. 9 provides a cross-sectional schematic view of a top portion of an interactive assembly of a system according to other exemplary embodiments of the present disclosure.
Figure 13:
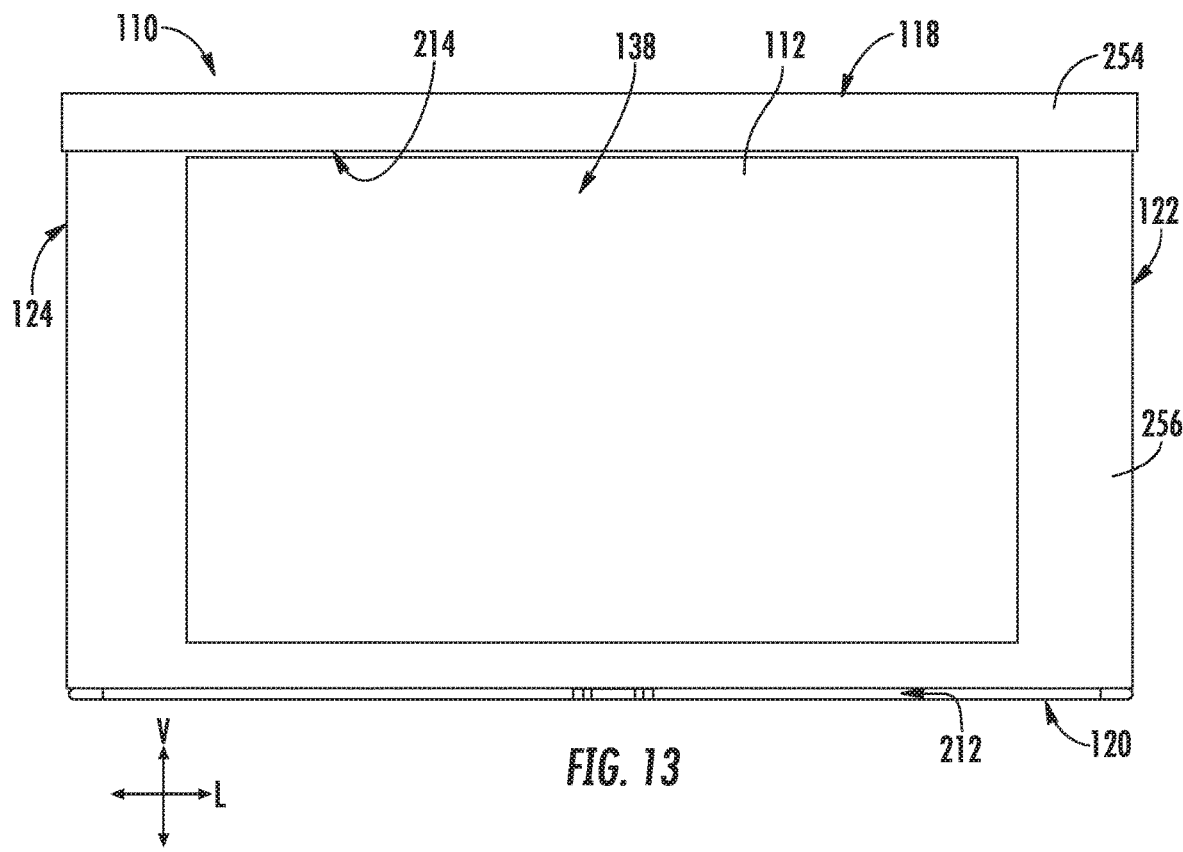
FIG. 13 provides a front perspective view of an interactive assembly of a system according to other exemplary embodiments of the present disclosure.

Turning now to FIGS. 9 and 13, various views are provided of other exemplary embodiments. In particular, exemplary embodiments may define second air outlet 214 in front of a bezel panel 256 of the image monitor 112. As shown, bezel panel 256 may frame imaging surface 138 the transverse direction T and lateral direction L. In other words, bezel panel 256 may extend about a perimeter of imaging surface 138 at a position forward therefrom. At least a portion of bezel panel 256 may hold, for instance, a front panel of imaging surface 138 in place (e.g., such that movement of the front panel in the transverse direction T is restricted). The lateral front plate 254 is formed by a discrete member forward from bezel panel 256. Second air outlet 214 may be defined forward from bezel panel 256. Coolant airflow path 250 may be formed directly on bezel panel 256 and imaging surface 138 (e.g., such that air from second air outlet 214 first flows over bezel panel 256 before flowing across imaging surface 138. In some such embodiments, second air outlet 214 extends along the lateral direction L from first side end 122 of hood casing 116 to second side end 124 of hood casing 116.

Returning to FIGS. 6 and 7, in certain embodiments, an exhaust passage 258 is defined within the hood casing 116. As shown exhaust passage 258 may extend in fluid isolation from air intake passage 222 and air outlet passages 224, 226. One or more interior exhaust duct walls 260 may separate the air passages 222, 224, 226 and exhaust passage 258. An exhaust inlet 262 and an exhaust outlet 264 are defined in fluid communication with exhaust passage 258 (e.g., through one or more external walls of hood casing 116). In some embodiments, exhaust inlet 262 is defined through hood casing 116 proximal the bottom end 120 (e.g., through a bottom wall or directly above cooktop surface 324—FIG. 2). In additional or alternative embodiments, exhaust outlet 264 is defined through hood casing 116 proximal to the top end 118 (e.g., through a top wall of hood casing 116). Optionally, exhaust outlet 264 may include a plurality of exhaust apertures, as shown in FIG. 3. In some such embodiments, exhaust outlet 264 may be positioned between the first aperture set 218 and the second aperture set 220 along the lateral direction L. Each of the first aperture set 218 and the second aperture set 220 that may be laterally spaced apart from the exhaust outlet 264 (e.g., to restrict the flow of exhaust to the air inlet 210).

An exhaust air handler 266 may be mounted within exhaust passage 258. As would be understood, exhaust air handler 266 may be provided as any suitable blower or fan (e.g., radial fan, tangential fan, etc.) positioned within hood casing 116 to actively rotated or motivate air, steam, or exhaust fumes through exhaust passage 258. During use, the heat, steam, or exhaust fumes 246 may be motivated by exhaust air handler 266 from open region 130 (FIG. 2) to exhaust passage 258 through exhaust inlet 262 into exhaust outlet 264 (e.g., as indicated at arrows 268). Optionally, one or more filters (not pictured) may be provided at exhaust inlet 262 (e.g., between open region 130 and exhaust passage 258) to clean the air, steam, or exhaust fumes (e.g., at 246) as it enters hood casing 116. For instance, a grease filter having a suitable coarse filter medium, such as a metallic mesh including aluminum or stainless steel, may be mounted across exhaust inlet 262. Additionally or alternatively, an odor filter having a suitable fine filter medium, such as a mesh or block including activated carbon, may be mounted across exhaust inlet 262. Optionally, the odor filter may be positioned above or downstream from the grease filter.

As illustrated, at least a portion of exhaust passage 258 may be tapered downstream from exhaust air handler 266. For instance, an angled top plate 270 may be positioned proximate to top end 118 within exhaust passage 258. Angled top plate 270 may extend, for instance downward, from exhaust outlet 264, thereby reducing the cross-sectional area of exhaust passage 258 and accelerating the flow rate of air or exhaust gases (e.g., at 268) upstream of exhaust outlet 264. As air or exhaust gases flow from exhaust outlet 264, the accelerated flow rate induced by angled top plate 270 may advantageously prevent exhaust gases from flowing to air inlet 210. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for motivating air adjacent to a cooktop appliance comprising a cooktop surface, the system defining a vertical direction, a lateral direction, and a transverse direction, the system comprising:
    a casing defining an air inlet and an air outlet above the cooktop appliance;
    an image monitor having an imaging surface on which an image is selectively displayed, the image monitor being supported on the casing above the air outlet; and
    an air handler mounted within the casing in fluid communication between the air inlet and the air outlet to motivate an airflow therethrough,
    wherein the air outlet defines an airflow curtain path for air exiting the casing, the airflow curtain path extending outward from the casing and forward along the transverse direction in front of the image monitor, and
    wherein the air inlet is defined through the casing above the air outlet, the air inlet being defined at a location behind the image monitor relative to the transverse direction.

2. The system of claim 1, wherein the air outlet is a first air outlet, wherein the casing further defines a second air outlet above the first air outlet, and wherein the second air outlet defines a coolant airflow path along the imaging surface.

3. The system of claim 2, wherein the second air outlet is defined above the imaging surface.

4. The system of claim 3, further comprising a bezel panel extending about a perimeter of the imaging surface at a position forward therefrom, wherein the second air outlet is defined forward from the bezel panel.

5. The system of claim 3, further comprising a bezel panel extending about a perimeter of the imaging surface at a position forward therefrom, wherein the second air outlet is defined between the bezel panel and the imaging surface.

6. The system of claim 2, wherein the air handler is positioned upstream from the first air outlet and the second air outlet.

7. The system of claim 2, wherein the air handler is a first air handler upstream from the first air outlet, and wherein the system further comprises a second air handler upstream from the second air outlet in fluid parallel to the first air handler.

8. The system of claim 1, wherein the casing extends in the vertical direction from a top end of the casing to a bottom end of the casing, and wherein the air inlet is defined through the casing proximal to the top end of the casing.

9. The system of claim 1, wherein the casing extends in the transverse direction between a front end of the casing and a rear end of the casing, and wherein the casing defines an air passage extending along the vertical direction from the air inlet between the front end of the casing and the rear end of the casing.

10. The system of claim 1, wherein the casing extends in the vertical direction from a top end of the casing to a bottom end of the casing, wherein the air handler is positioned within an air passage extending between the air inlet and the air outlet, wherein the casing further defines an exhaust passage extending in fluid isolation from the air passage from an exhaust inlet proximal to the bottom end and an exhaust outlet proximal to the top end of the casing.

11. A system for motivating air adjacent to a cooktop appliance comprising a cooktop surface, the system defining a vertical direction, a lateral direction, and a transverse direction, the system comprising:
    a casing defining an air inlet, a first air outlet, and a second air outlet above the cooktop appliance, the second air outlet being above the first air outlet;
    an image monitor supported on the casing above the first air outlet, the image monitor comprising an imaging surface on which an image is selectively displayed; and
    an air handler mounted within the casing in fluid communication between the air inlet and the first air outlet to motivate an airflow therethrough,
    wherein the first air outlet defines an airflow curtain path for air exiting the casing, the airflow curtain path extending outward from the casing and forward along the transverse direction in front of the image monitor,
    wherein the second air outlet defines a coolant airflow path extending from a position above the imaging surface and therealong,
    wherein the air inlet is defined through the casing above the air outlet, the air inlet being defined at a location behind the image monitor relative to the transverse direction, and
    wherein the air handler is positioned upstream from the first air outlet and the second air outlet.

12. The system of claim 11, wherein the air inlet is defined through the casing behind the image monitor relative to the transverse direction.

13. The system of claim 12, further comprising a bezel panel extending about a perimeter of the imaging surface at a position forward therefrom, wherein the second air outlet is defined forward from the bezel panel.

14. The system of claim 12, further comprising a bezel panel extending about a perimeter of the imaging surface at a position forward therefrom, wherein the second air outlet is defined between the bezel panel and the imaging surface.

15. The system of claim 11, wherein the casing extends in the vertical direction from a top end of the casing to a bottom end of the casing, and wherein the air inlet is defined through the casing proximal to the top end of the casing.

16. The system of claim 11, wherein the casing extends in the transverse direction between a front end of the casing and a rear end of the casing, and wherein the casing defines an air passage extending along the vertical direction from the air inlet between the front end of the casing and the rear end of the casing.

17. The system of claim 11, wherein the casing extends in the vertical direction from a top end of the casing to a bottom end of the casing, wherein the air handler is positioned within an air passage extending between the air inlet and the air outlet, wherein the casing further defines an exhaust passage extending in fluid isolation from the air passage from an exhaust inlet proximal to the bottom end of the casing and an exhaust outlet proximal to the top end of the casing.

* * * * *